(12) United States Patent
Hsu et al.

(10) Patent No.: US 6,512,275 B1
(45) Date of Patent: *Jan. 28, 2003

(54) SEMICONDUCTOR INTEGRATED CIRCUITS

(75) Inventors: Louis Lu-chen Hsu, Fishkill; Jack Allan Mandelman, Stormville, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/473,908

(22) Filed: Dec. 28, 1999

Related U.S. Application Data

(63) Continuation of application No. 09/007,906, filed on Jan. 15, 1998, now Pat. No. 6,069,390.

(51) Int. Cl.⁷ .............................................. H01L 27/088
(52) U.S. Cl. ...................... 257/371; 257/374; 257/396; 257/401; 257/623; 257/900; 438/135
(58) Field of Search ................................ 257/371, 374, 257/396, 401, 623, 900; 438/135

(56) References Cited

U.S. PATENT DOCUMENTS

| | | |
|---|---|---|
| 4,648,173 A | 3/1987 | Malaviya |
| 4,649,625 A | 3/1987 | Lu |
| 4,688,073 A | 8/1987 | Goth et al. |
| 4,816,884 A | 3/1989 | Hwang et al. |
| 4,833,516 A | 5/1989 | Hwang et al. |
| 4,914,628 A | 4/1990 | Nishimura |
| 4,988,637 A | 1/1991 | Dhong et al. |
| 5,008,214 A | 4/1991 | Redwine |
| 5,106,775 A | 4/1992 | Kaga et al. |
| 5,264,716 A | 11/1993 | Kenney |
| 5,360,758 A | 11/1994 | Bronner et al. |
| 5,443,992 A | 8/1995 | Risch et al. |
| 5,466,625 A | 11/1995 | Hsieh et al. |
| 5,466,636 A | 11/1995 | Cronin et al. |
| 5,508,219 A | 4/1996 | Bronner et al. |
| 5,528,062 A | 6/1996 | Hsieh et al. |
| 5,547,903 A | 8/1996 | Hsu |
| 5,581,101 A | 12/1996 | Ning et al. |
| 5,585,657 A | 12/1996 | Efland et al. |
| 5,614,431 A | 3/1997 | Debrosse |
| 5,643,815 A | 7/1997 | Vu et al. |
| 5,691,549 A | 11/1997 | Lam et al. |
| 5,763,285 A | 6/1998 | Yang |
| 5,780,325 A | 7/1998 | Lee |
| 5,814,895 A | 9/1998 | Hirayama |
| 6,069,390 A | * 5/2000 | Hsu et al. .................... 257/371 |

FOREIGN PATENT DOCUMENTS

JP    5-343679    12/1993

OTHER PUBLICATIONS

IBM Technical Disclosure Bulletin, vol. 32, No.9A, Feb. 1990, High Density DRAM Cell (Q–Elope Cell), pp. 478–482).

T. Ozaki, et al., "0.228m2 Trenc Cell Technologies with Bottle Shaped Capacitor for 1Gbit DRAMS", 1995, IEEE, pp. 27.3.1. 1–27.3.4.

D. Hisamoto, et al., "A Fully Depleted Lean–Channel Transistor (DELTA) . . . ", IEEE 1989 ps. 34.5.1–34.5.4.

* cited by examiner

Primary Examiner—Tom Thomas
Assistant Examiner—Donghee Kang
(74) Attorney, Agent, or Firm—Daryl K. Neff

(57) ABSTRACT

A semiconductor apparatus and method for making the same is disclosed herein in which the semiconductor apparatus includes a first active device formed in a mesa region of semiconductor material formed on one or more sidewalls of an isolation region, and a conductive path which extends from the active device in a linear direction of the mesa. An embodiment is disclosed in which a plurality of active devices are formed in the mesa region and electrically connected thereby.

17 Claims, 5 Drawing Sheets

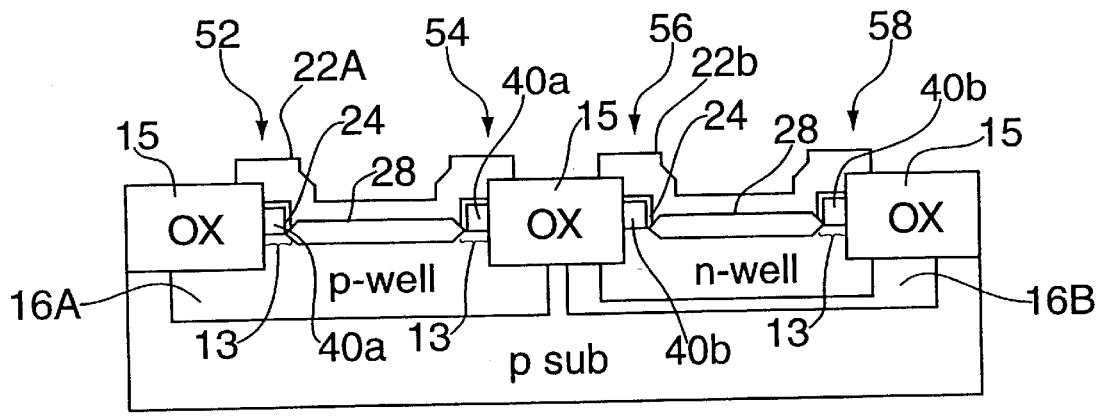
FIG. 4
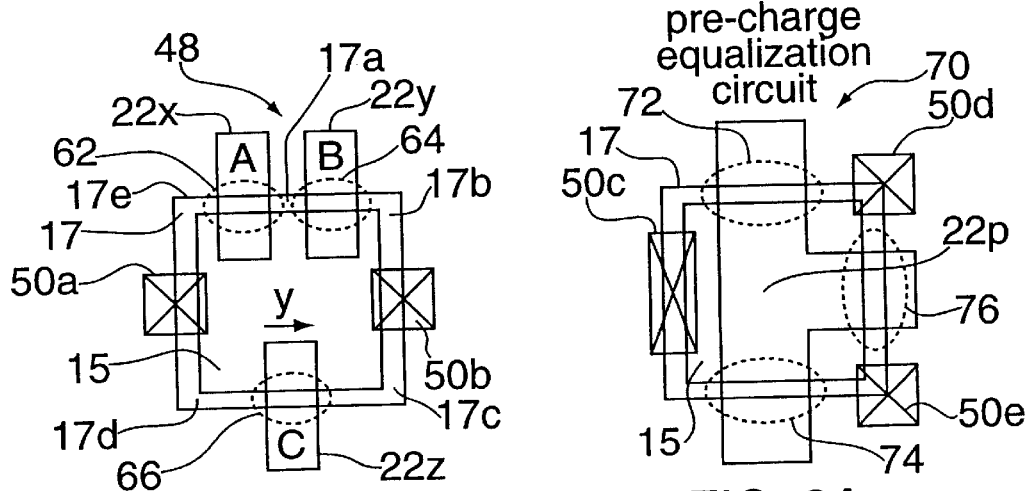
FIG. 5A
FIG. 6A
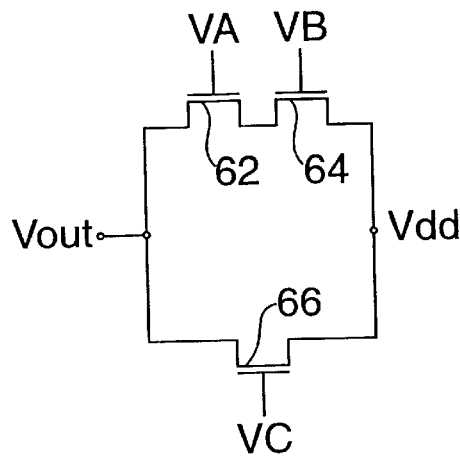
FIG. 5B
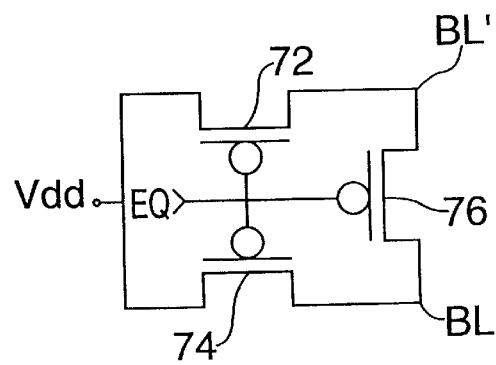
FIG. 6B

BORDERLESS BODY CONTACT

SEMICONDUCTOR INTEGRATED CIRCUITS

RELATED APPLICATION DATA

This application is a continuation of Ser. No. 09/007,906 now U.S. Pat. No, 6,069,390 filed Jan. 15, 1998.

This application is related to Applicants' U.S. patent application entitled "Transistor Having A Substantially Isolated Body" and further identified as Ser. No. 09/007,908 filed Jan. 15, 1998, which application is incorporated herein in its entirety by reference.

The invention relates to semiconductor devices and more specifically to integrated semiconductor device circuits.

BACKGROUND OF THE INVENTION

In semiconductor integrated circuits, as the scale of integration increases, it is important to find new ways to reduce the area occupied by circuits while satisfying ever increasing demands for higher speed and lower power consumption.

For the majority of semiconductor integrated circuits produced today, transistors are fabricated within wells formed in a bulk semiconductor substrate. This method of fabrication places the following limitations, among others, on the integrated circuits produced therefrom: the area of substrate occupied by the transistor is not less than minimum lithographic dimensions; the width to length (W/L) ratio of the transistor is not greater than the dimensions defined in the plane of the substrate; and contact studs and metallization at a separate level are necessary to make a connection between each transistor and any other transistor.

Accordingly, it is an object of the invention to provide an apparatus including an active device formed in a substantially continuous mesa region of semiconductor material formed on one or more sides of an isolation region, in which the apparatus includes a conductive path formed in the mesa region which extends in a linear direction of the mesa region.

Accordingly, it is an object of the present invention to provide semiconductor integrated circuits in which active devices such as transistors therein have a W/L ratio which is controllable independently from the dimensions that the active devices extend in the plane of the substrate.

It is another object of the invention to provide integrated circuits in which multiple active devices are self-linked, i.e. do not require separate level metallization for linking.

Still another object of the invention is to provide integrated circuits which occupy very little area of the substrate as gauged by minimum lithographic dimensions.

SUMMARY OF THE INVENTION

These and other objects of the invention are provided by the semiconductor apparatus and method for making the same of the present invention. Accordingly, in a first embodiment, the semiconductor apparatus includes a first active device formed in a substantially continuous mesa region of semiconductor material formed on one or more sidewalls of an isolation region, and a conductive path which extends from the active device in a linear direction of the mesa. In a preferred embodiment of the invention, a plurality of active devices are formed in the mesa region and are electrically connected thereby to form circuits such as a logic gate, or a precharge/equalization device.

Preferably, the conductive path comprises a metal, and more preferably a refractory metal. Most preferably the conductive path contains a compound of the metal with the semiconductor material present therein, e.g. to form a compound such as tungsten silicide.

In another aspect of the invention, active devices are formed in first portions of a substantially continuous mesa region of semiconductor material and second portions lying between the active devices are allowed to remain as conductive paths which interconnect the active devices.

In another aspect of the invention, a plurality of tightly pitched, discrete, active devices is fabricated by forming a substantially continuous mesa region of semiconductor material on one or more sides of an isolation region; photolithographically defining a break in the mesa region; and forming active devices in broken portions of the mesa region.

In another aspect of the invention, a CMOS inverter is fabricated by forming a substantially continuous mesa region of semiconductor material on one or more sides of an isolation region; forming an n channel field effect transistor (NFET) and a p channel field effect transistor (PFET) in the mesa region, the NFET and PFET having gates linked by a common gate conductor and at least one source/drain region of the NFET and PFET being conductively connected by a conductive path formed in the mesa region; and forming a contact to the gate conductor for a voltage signal input and a contact to the conductive path for an inverter output contact.

BRIEF DESCRIPTION OF THE DRAWINGS

FIG. 4 is a cross-section view showing two pairs of sidewall supported FETs, as formed on a substrate.

FIG. 5a contains a top view of a physical implementation of a logic gate utilizing FETs constructed according to the present invention.

FIG. 5b is a schematic diagram corresponding to the logic gate shown in FIG. 5a.

FIG. 6a contains a top view of a physical implementation of a precharge and equalization circuit utilizing FETs constructed according to the present invention.

FIG. 6b is a schematic diagram corresponding to the precharge and equalization circuit shown in FIG. 6a.

FIG. 7b is a top view corresponding to the device arrangement shown in FIG. 7a.

DETAILED DESCRIPTION OF THE PREFERRED EMBODIMENTS

The field effect transistors which form the active devices of the integrated circuits described herein are disclosed in the U.S. patent application entitled "Transistor Having A Substantially Isolated Body" and further identified as Ser. No. 09/007,908 and filed Jan. 15, 1998, which application is incorporated herein in its entirety by reference.

Figure 1:
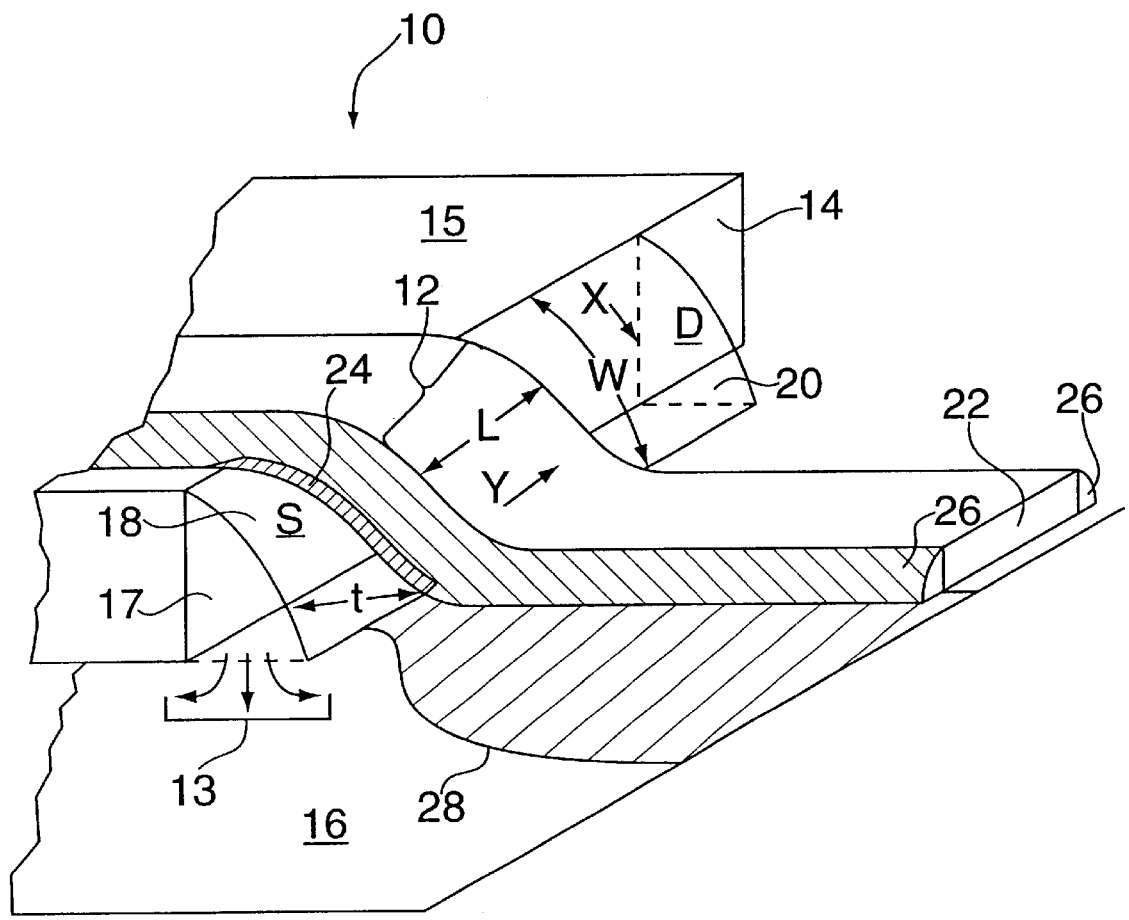
FIG. 1 is a perspective view of a field effect transistor (FET) from which the integrated circuits of the present invention are constructed.

As described in that application, FIG. 1 contains a perspective view of an insulated gate field effect transistor (IGFET) 10 which forms a suitable active device for use in the embodiments of invention described in the following. The IGFET 10 includes an active device region 17 in a substantially continuous mesa region of semiconductor material formed on a sidewall 14 of an isolation region 15. The active device region 17 electrically and physically contacts the substrate 16 of semiconductor material through a neck region 13 which permits the exchange of charge carriers between the active device region 17 and the substrate, but is otherwise isolated therefrom. Thus, charge carriers can pass between active device region 17 and substrate 16 through neck region 13.

The semiconductor material of the substrate 16 is preferably monocrystalline silicon but can be any semiconductor material, including but not limited to silicon, silicon germanium (SiGe), silicon carbide (SiC), or any of several Group III–Group V compounds such as gallium arsenide (GaAs) or indium phosphide (InP), etc. The semiconductor material of the active device region 17 need not be the same as that of the substrate 16 and likewise can be any semiconductor material, including but not limited to silicon, silicon germanium (SiGe), silicon carbide (SiC), or any of several Group III–Group V compounds such as gallium arsenide (GaAs) or indium phosphide (InP), etc.

To form an active device region 17 which contains a different material than that of the substrate, for example, a device region which contains silicon germanium over a substrate consisting essentially of silicon, an upper layer containing the second material is formed over the substrate containing the first material and the techniques described in Applicants' herein incorporated U.S. patent application "Transistor Having a Substantially Isolated Body" are performed to define the active device region 17. It will be understood that the upper layer can be formed by exposing the substrate to ions of the desired upper layer materials in gaseous form to promote growth of a crystalline upper layer starting from the crystal lattice of the substrate. However, when such a process would result in significant mismatch of the crystal lattices between the upper layer and the substrate, as in the case of an-upper layer of silicon germanium grown over a substrate of silicon, the upper layer is preferably formed by implanting ions of the different material into an upper region or upper layer which has the same crystal structure or is compatible with that of the substrate. For example, germanium ions would be implanted into an upper layer over a substrate or in an upper region of a silicon substrate to form an upper layer which has a different material composition (SiGe) than that of the substrate (Si).

The active device region 17 of IGFET 10 includes a body 12 and source and drain regions 18, 20 formed on respective sides of the body 12. The body 12 forms a central channel region of the IGFET and is obstructed from view in FIG. 1 by gate conductor 22, preferably formed by a photolithographically defined deposition of a conductive material such as polysilicon followed by conformal deposition of a layer of a material such as silicon nitride ($Si_xN_y$) to form spacers 26 on the sidewalls of the deposited conductive material.

A gate dielectric 24 is formed as a thin film on body 12 and separates the body 12 from the gate conductor 22 deposited thereon. Portions of the gate dielectric 24 overlaying source and drain regions 18, 20 are removed to form device contacts (not shown). Alternatively, the gate dielectric 24 can be deposited only over portions of the active device region 17 including the body 12 over which the gate conductor 22 is deposited and contact then made to source and drain regions 18, 20 where those portions are not covered by gate dielectric 24. Portions of the gate conductor 22 overlaying the substrate 16 are insulated therefrom by a field isolation region 28, which is preferably a field oxide grown by exposing the substrate 16 to an oxidizing ambient at elevated temperature after formation of the isolation region 15 and device region 17.

Figure 2:
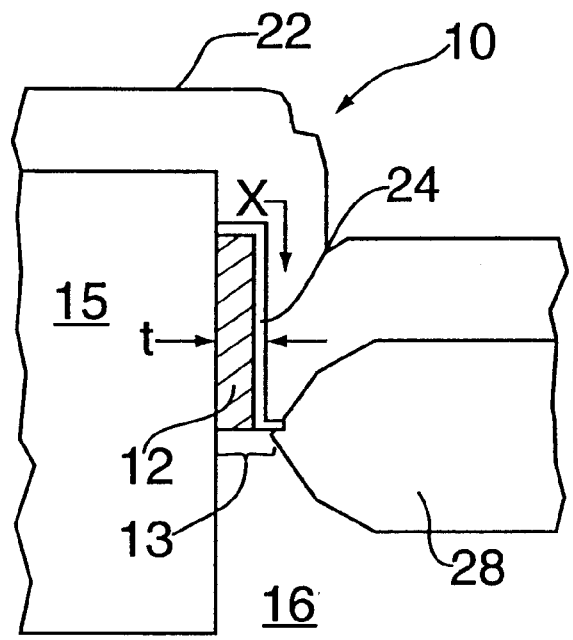
FIG. 2 is a cross-section view of a sidewall supported FET from which the integrated circuits of the present invention are constructed.

One such IGFET device 10 which has a body 12 supported on a sidewall of a shallow trench isolation region 15 is shown in FIG. 2. Isolation of device 10 is asymmetric in that body 12 of device 10 is supported on one side on a sidewall of shallow trench isolation region 15 but is isolated on another side from other circuit elements (not shown) by field oxide region 28. As will be understood from FIG. 2, the width to length (W/L) ratio of the device 10 is high because the outer perimeter X of the body 12 is the channel width W of the IGFET, while the length L is the smaller dimension over which the gate conductor extends in the linear direction Y of the body, as shown in FIG. 1. Moreover, since the width W of device 10 extends substantially in the vertical direction, the W/L ratio can be increased without change in the amount of area which is occupied by the completed device 10 on the surface of a wafer. As described in Applicants' above-noted co-pending U.S. patent application entitled "Transistor Having a Substantially Isolated Body" Ser. No. 09/007,908, the thickness t of the body 12 can be limited by the fabrication process to sublithographic scale to provide small body volume which, in turn, permits strong gate control and low back bias sensitivity.

Figure 3:
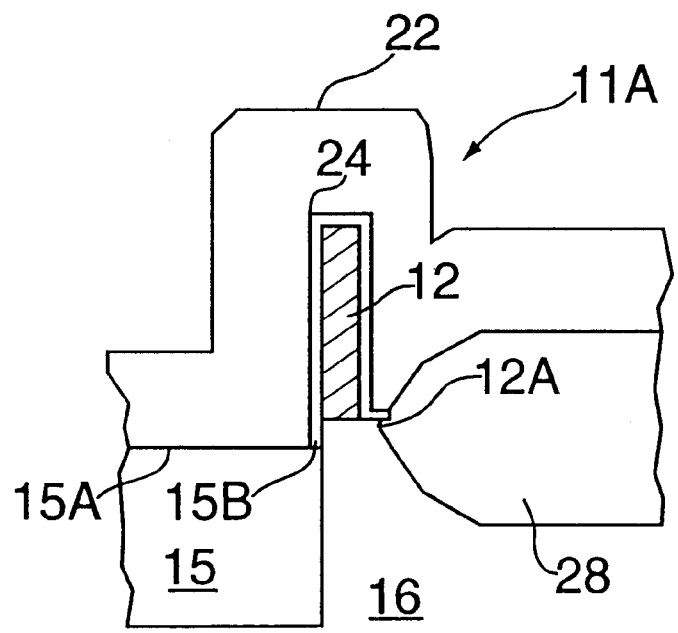
FIG. 3 is a cross-section view of a FET having a channel region enclosed by gate conductor, from which FET the integrated circuits of the present invention are constructed.

FIG. 3 is a cross-section view showing an IGFET device 11a in which gate conductor 22 is wrapped around the body 12 which forms the channel region of the IGFET device. As will be understood, shallow trench isolation region 15 and field oxide region 28 form large isolation regions which largely eliminate parasitic capacitances and unwanted coupling between adjacent IGFET devices on the substrate 16.

FIG. 4 is a cross-section view which illustrates one way in which more than one IGFET device can be operated by the same gate conductor. In FIG. 4, IGFETs 52 and 54 are n-channel devices formed in mesa regions of semiconductor material, i.e. active device regions 40a which are isolated from each other and from other active devices on the substrate by shallow trench isolation regions 15 and field isolation regions 28.

The channel portion of device regions 40a are appropriately doped, typically to p-type and overlayed by a gate dielectric film 24, and gate conductor 22a. As described above, device regions 40a contact the substrate at p-well 16a through neck regions 13. The structure of n-channel IGFETs 56 and 58 differs from p-channel IGFETs 52 and 54 only in that the channel portion of the device regions 40b in IGFETs 56 and 58 overlay an n-well region 16b of the substrate.

A top view of a circuit 48 including a plurality of active devices which is constructed according to the invention is shown in FIG. 5a. The circuit 48 can be utilized as a logic gate, but the following description is not intended to be limited to logic circuitry. An active device region 17 of single crystal semiconductor material is formed as a continuous mesa region of semiconductor material, either on a sidewall of an isolation region 15 (as shown in FIGS. 1–2) or as a region enclosed by a gate conductor in wrap-around manner as shown in and described with reference to FIG. 3. Within the active device region 17 are formed a plurality of active devices 62, 64, 66, for example IGFETs of the type described in the foregoing with reference to FIGS. 1–3. Gate conductors 22x, 22y, and 22z of the respective IGFETs 62, 64, 66 are preferably formed by photolithographically defined deposition of a conductive material, over which a conformal layer 26 of material such as silicon nitride is deposited to form sidewall spacers 26, as described above with reference to FIG. 1.

Between respective active devices 62, 64, 66 the mesa region of semiconductor material which forms the active device region 17 includes conductive paths 17a, 17b, 17c, 17d, 17e which extend in the linear direction of the mesa region, i.e. in a direction along the length of the mesa region which is substantially coplanar with or parallel to the plane of the substrate 16, such that adjacent active devices, for example devices 62, 64, are conductively connected by a conductive path 17a.

An important and fundamental aspect of the invention which is independent of the particular arrangement of active devices 62, 64, 66 in circuit 48 is now emphasized. The active device region 17 is formed in a mesa region of semiconductor material which includes both 1) an active semiconductor device, for example an IGFET device 62; and 2) conductive paths 17a, 17e which extend in a linear direction of the mesa region from the active semiconductor device 62 which provide interconnection of that active device 62 with other active devices, for example active devices 64, 66. Thus, conductive paths 17a, 17e extending from active device 62 obviate the need for conventional interconnections such as those made by defining interconnect features at a second level; and forming contact studs to connect the active devices at the first (substrate) level to the interconnect features.

To enhance the performance of a circuit formed by the interconnection of active devices 62, 64, 66, the resistance of conductive paths 17a–17e which link the devices 62, 64, 66 can be lowered by depositing a metal thereon, preferably a refractory metal, and by preferably heating the processed substrate in a chamber to produce a compound of the deposited metal with a semiconductor material present in the active device region 17.

Contacts 50a and 50b to portions of the mesa region which form conductive paths 17b–17c, 17d–17e extending from the source/drain regions of active devices 62, 64, 66 are made through holes etched in the gate dielectric (24; FIG. 1) or interlevel dielectric (not shown) deposited over the circuit 48. Contacts 50a, 50b provide $V_{dd}$ (power supply) and $V_{GND}$ (ground), respectively, to circuit 48.

When circuit 48 is to be used as a logic gate, active devices 62, 64, 66 are IGFET devices constructed in the manner described above with reference to FIGS. 1 and 2 or FIGS. 1 and 3. Signal voltages $V_A$, $V_B$ and $V_C$ representing the logic inputs to logic gate 48 are applied to each of the gate conductors 22x, 22y and 22z. An equivalent schematic for the logic gate 48 is shown in FIG. 5b. As shown in FIG. 5b, Signal voltages $V_A$, $V_B$ and $V_C$ are supplied to the gates of IGFETs 62, 64, 66, while the voltage supply input is provided as $V_{dd}$ through contact 50b to device region 17 and the output voltage $V_{OUT}$ is taken at contact 50a.

A physical implementation of a precharge and equalization circuit 70 for a sense amplifier of an integrated circuit memory is shown in FIG. 6a. In this circuit, as in the circuit of logic gate 48, a device region 17 is formed as a continuous mesa region of semiconductor material as described above with reference to FIG. 5a in the foregoing. IGFET devices 72, 74, and 76 are formed having channel regions underlying a linked gate conductor 22p formed by a single photolithographically defined pattern, thereby tying the gates thereof together. IGFET devices 72, 74, and 76 are preferably p-channel devices in order to provide refresh when signal EQ is at its lowest level. However, IGFETs 72, 74 and 76 may be n-channel devices if reverse polarities are desired. Contact 50c is made to a source/drain region of device region 17 for a supply voltage $V_{dd}$. Contacts 50d and 50e are made to source drain regions of the device region 17 for a pair of bitlines BL and BL'. An equivalent electrical schematic of precharge/equalization circuit 70 is shown in FIG. 6b, where signal EQ is used as to trigger the equalization operation and to charge bitlines BL and BL' from power supply voltage $V_{dd}$.

Figure 7A:
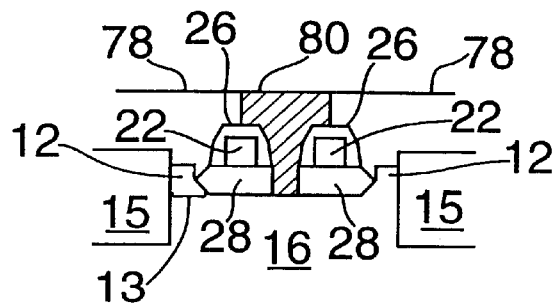
FIG. 7a is a cross-section view illustrating the fabrication of a borderless body contact within a device arrangement including FETs constructed according to the present invention.
Figure 7B:
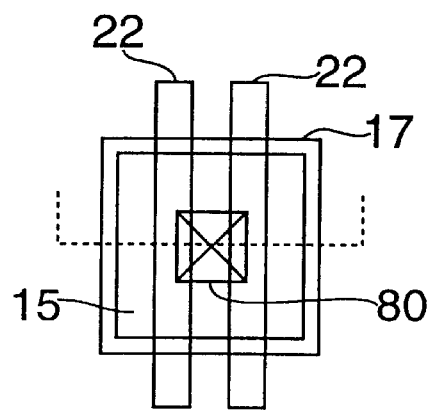

FIGS. 7a and 7b show a cross-sectional view along the dotted line and a top view, respectively, of a structure in which a borderless contact 80 is formed to the semiconductor substrate 16 between two adjacent gate conductors 22 crossing between shallow trench isolation regions 15. Borderless contact is achieved by etching through an interlevel dielectric layer 78 of oxide and field oxide regions 28 with an etchant selective to the material of the conformal layer 26 (e.g. silicon nitride) which covers the gate conductors 22.

Figure 8A:
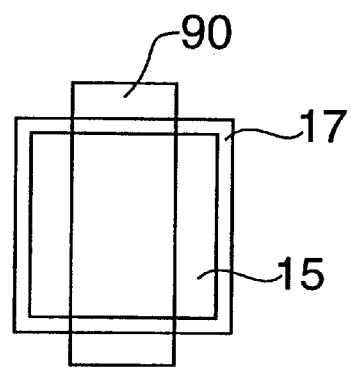
FIG. 8a contains a top view of a substrate illustrating a trim step in fabrication of multiple separate FETs according to the present invention.
Figure 8B:
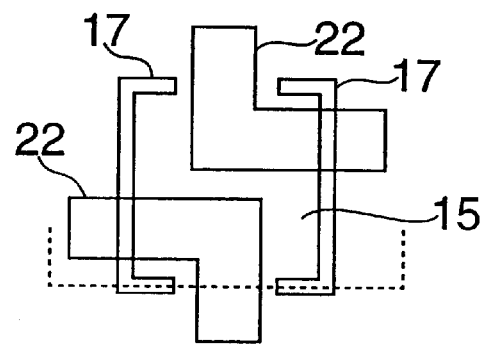
FIG. 8b contains a top view illustrating a completed arrangement of multiple separate FETs.
Figure 8C:
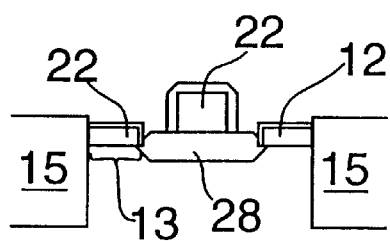
FIG. 8c contains a cross-section view corresponding to FIG. 8b.

FIGS. 8a, 8b, and 8c illustrate steps in a processing method which results in the fabrication of two separated FET devices. With reference to FIG. 8a, a continuous mesa region of semiconductor material is formed as a device region 17, as described in the foregoing. Then, a trim mask 90 is applied, in order that corresponding portions of the device region 17 be removed by etching. A top view and a cross-sectional view along the dotted line of the structure are shown in FIGS. 8b and 8c, respectively.

Figure 9A:
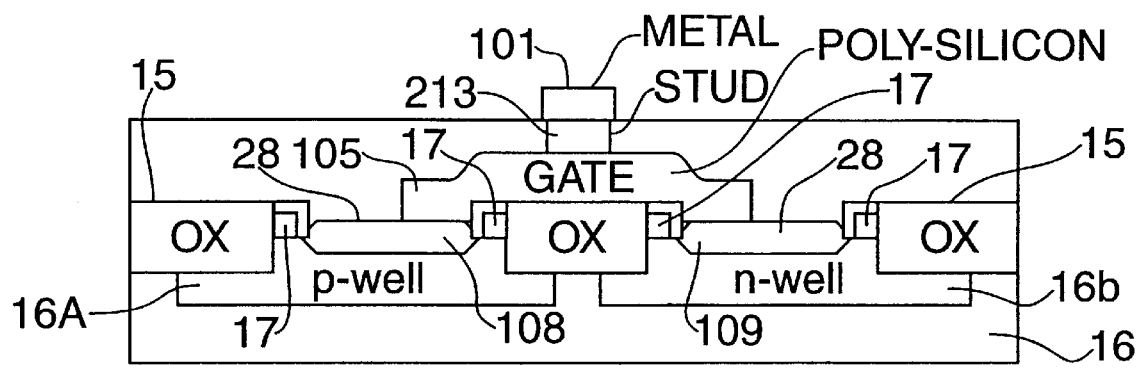
FIG. 9a is a cross-section view showing the construction of a two-stage CMOS inverter of the invention.
Figure 9B:
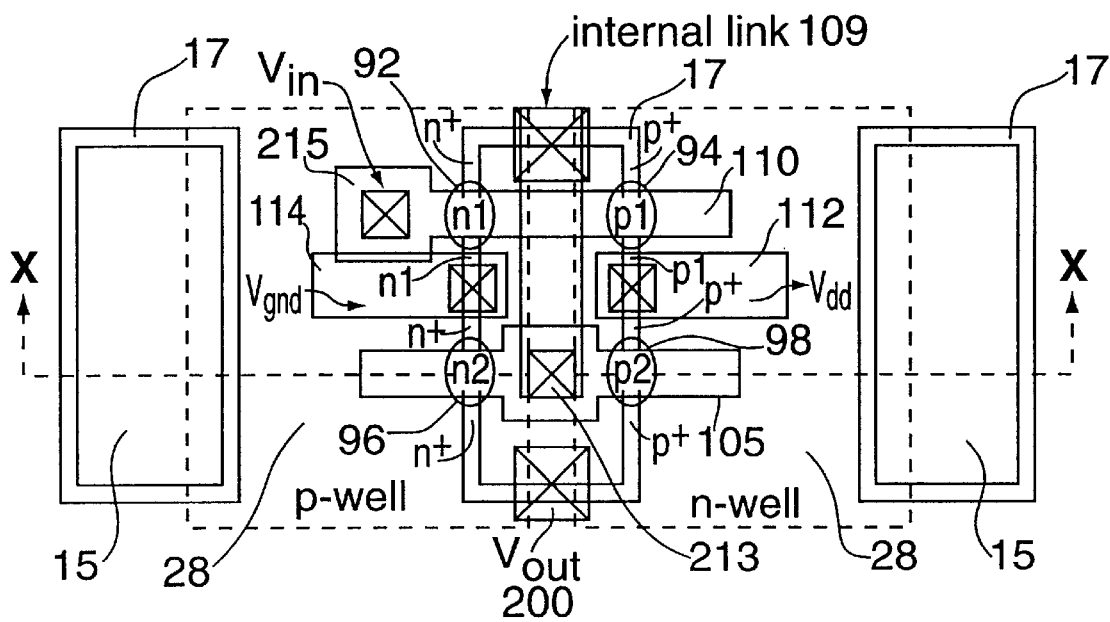
FIG. 9b is a top view showing the construction of a two-stage CMOS inverter of the invention.
Figure 9C:
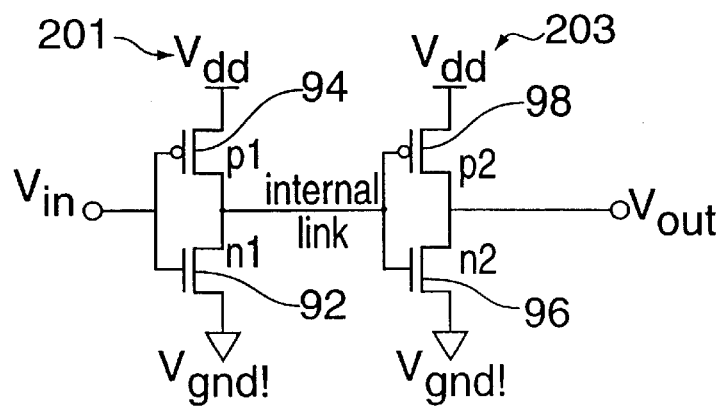
FIG. 9c is a schematic diagram showing the interconnection of devices in the two-stage CMOS inverter of the invention.

FIGS. 9a, 9b, and 9c show a cross-sectional view along the x–x' line, a top view, and a schematic diagram, respectively, for a two-stage complementary metal-oxide-semiconductor (CMOS) inverter according to a further embodiment of the invention. As shown in FIG. 9c, NFET 92 and PFET 94 form a first inverter stage, to which an input signal voltage $V_{IN}$ is applied, and NFET 96 and PFET 98 form a second inverter stage which receives an input signal voltage from the output of the first inverter stage and provides an output voltage $V_{OUT}$. A power supply voltage is applied as $V_{DD}$ to the source terminals of PFETs 94 and 98, while the source terminals of NFETs 92 and 96 are tied to signal ground $V_{GND}$.

A top view showing a preferred embodiment of an extremely compact layout for the two-stage inverter is shown in FIG. 9b. With reference to FIGS. 9a and 9b, a device region 17 is formed as a continuous mesa region of semiconductor material which is isolated from other devices by isolation regions 15 and 28. It will be appreciated that the dimensions of the two-stage inverter in the plane of the substrate 16, are approximately the same as that of an isolation region 15 and are small in terms of minimum lithographic feature size F. In the CMOS inverter shown in FIG. 9b, for example, the dimensions of the isolation region 15 are approximately 5F by 3F. NFETs 92 and 96 are formed with n+ doped source/drain regions of the device region 17 which overlay p-well 16a and PFETs 94 and 98 are formed with p+ doped source/drain regions of the device region 17 which overlay n-well 16b.

NFET 92 and PFET 94 of the first inverter stage are coupled by a common gate conductor 110. The output of the first inverter stage 109 is strapped by a metal interconnect 101 (FIG. 9a) to the input of the second inverter stage 213 at gate conductor 105 which links NFET 96 and PFET 98 of the second stage. First and second inverter stages 201, 203 share the same contacts 112, 114 to a source of power supply voltage $V_{DD}$ and to ground $V_{GND}$, respectively. The voltage signal input $V_{in}$ to the first inverter stage 201 is through contact 215 to gate conductor 110. The output voltage signal $V_{OUT}$ is through contact 200 to device region 17.

While the invention has been described herein with reference to certain preferred embodiments thereof, those skilled in the art will recognize the many modifications and enhancements which can be made without departing from the true scope and spirit of the invention.

What is claimed is:

1. An apparatus including an active semiconductor device, comprising:
    a trench isolation region having one or more sidewalls protruding above a surface of a semiconductor substrate;
    a mesa region of semiconductor material adjoining said one or more protruding sidewalls of said isolation region, said mesa region extending along said one or more sidewalls in a first direction substantially parallel with the surface plane of said substrate and substantially parallel with said one or more sidewalls;
    an active device in said mesa region having one or more p-n junctions oriented in said first direction; said active device having a conduction channel having length extending in said first direction and having width extending in a direction substantially vertical to said semiconductor substrate; and
    a conductive path located in said mesa region and extending in said first direction from said active device.

2. The apparatus of claim 1 wherein said active device is of the field effect transistor type (FET) and said conductive path comprises a path extending from a source/drain region of said FET.

3. The apparatus of claim 2 wherein said FET comprises a first dopant at a first dopant concentration in a channel region thereof, and said conductive path comprises a second dopant at a second dopant concentration which is higher than said first dopant concentration.

4. The apparatus of claim 1 wherein said active device comprises a first semiconductor material and said conductive path comprises said first semiconductor material.

5. The apparatus of claim 4 wherein said conductive path further comprises a metal.

6. The apparatus of claim 5 wherein said conductive path further comprises a compound of said first semiconductor material with said metal.

7. The apparatus of claim 6 wherein said metal is selected from the group consisting of refractory metals.

8. The apparatus of claim 1 further comprising a second active device formed in said mesa region and conductively connected to said first active device through said conductive path.

9. The apparatus of claim 8 further comprising means coupled to said conductive path for receiving at least one electrical input and means for providing an electrical output dependent upon the state of said electrical input.

10. The apparatus of claim 9 wherein said means for receiving includes means for receiving first and second independently variable electrical inputs and said electrical output depends upon the state of said electrical inputs such that said apparatus forms a logic gate.

11. The apparatus of claim 9 wherein said active devices include an insulated gate field effect transistor (IGFET) having a channel region and at least a pair of source-drain regions.

12. The apparatus of claim 1 wherein said mesa region is joined to said semiconductor substrate for exchange of charge carriers therewith.

13. An apparatus including an active semiconductor device, comprising:
    a trench isolation region having one or more sidewalls protruding above a surface of a semiconductor substrate;
    a mesa region of semiconductor material adjoining said one or more protruding sidewalls of said isolation region, said mesa region extending along said one or more sidewalls in a first direction substantially parallel with the surface plane of said substrate and substantially parallel with said one or more sidewalls;
    first and second active devices in said mesa region each having one or more p-n junctions oriented in said first direction, each said active device having a conduction channel having length extending in said first direction and having width extending in a direction substantially vertical to said semiconductor substrate; and
    a conductive path located in said mesa region and extending in said first direction between said first and second active devices.

14. The apparatus of claim 13 further comprising a contact conductively coupled to said conductive path which outputs a voltage dependent upon the state of electrical input provided to said first active device.

15. The apparatus of claim 14 wherein said electrical input is provided to a gate of said first active device.

16. The apparatus of claim 15 wherein first and second independently variable electrical inputs are provided to respective gates said first and second active devices and said electrical output depends upon the state of said electrical inputs such that said apparatus forms a logic gate.

17. The apparatus of claim 13 wherein each of said first and second active devices are of the insulated gate field effect transistor (IGFET) type having a channel region and at least a pair of source-drain regions.

* * * * *